United States Patent [19]
Yajima et al.

[11] Patent Number: 5,936,244
[45] Date of Patent: Aug. 10, 1999

[54] ELECTRON MICROSCOPE AND ELECTRON MICROSCOPY METHOD

[75] Inventors: Yusuke Yajima, Kodaira; Yoshio Takahashi, Kunitachi; Hiroshi Suzuki, Kodaira; Katsuhiro Kuroda, Hachioji, all of Japan

[73] Assignee: Hitachi, Ltd., Tokyo, Japan

[21] Appl. No.: 08/973,898

[22] PCT Filed: Jun. 26, 1995

[86] PCT No.: PCT/JP95/01273

§ 371 Date: Dec. 18, 1997

§ 102(e) Date: Dec. 18, 1997

[87] PCT Pub. No.: WO97/01862

PCT Pub. Date: Jan. 16, 1997

[51] Int. Cl.[6] .................................................. H01J 37/244
[52] U.S. Cl. ............................................................ 250/310
[58] Field of Search ................................. 250/310, 311, 250/306, 307, 397

[56] References Cited

U.S. PATENT DOCUMENTS

| 4,440,475 | 4/1984 | Colliaux | 250/310 |
| 4,900,932 | 2/1990 | Schäfer et al. | 250/310 |

FOREIGN PATENT DOCUMENTS

| 61-78041 | 4/1986 | Japan . |
| 62-139240 | 6/1987 | Japan . |
| 2-199757 | 8/1990 | Japan . |

OTHER PUBLICATIONS

Surface Science, vol. 13, No. 9, "Spin–Polarized Scanning Electron Microscope", K. Hayakawa, pp. 512–517, Aug. 3, 1992.

Primary Examiner—Kiet T. Nguyen
Attorney, Agent, or Firm—Fay, Sharpe, Beall, Fagan, Minnich & McKee

[57] ABSTRACT

An electron microscope for observing a magnetization state of a specimen with high resolution and an electron microscopic method. The electron microscope comprises an electron beam irradiating device including a scanning coil 3 and an objective lens 4 to irradiate an electron beam 2 emitted from an electron source 1 on a desired part of a specimen 51, and a circularly polarized light detector including a quarter wave plate 8, a polarizer 9 and a photodetector 11 to detect circularly polarized light generated from the electron beam irradiated part of the specimen 51. Since the intensity of the circularly polarized light generated from the specimen irradiated with the electron beam depends on the direction of magnetization in the electron beam irradiated part and the detecting direction, the distribution of magnetization can be measured by observing a scanning image in the form of a luminance signal indicative of the intensity of the circularly polarized light while scanning the electron beam irradiated part on the surface of the specimen.

5 Claims, 15 Drawing Sheets

1μm

100nm

ELECTRON MICROSCOPE AND ELECTRON MICROSCOPY METHOD

TECHNICAL FIELD

The present invention relates to electron microscopes and electron microscopic methods and more particularly, to an electron microscope and an electron microscopic method which are suitable for observing a magnetization state of a magnetic specimen of desired thickness with high resolution.

BACKGROUND ART

As techniques of observing a magnetization state of a magnetic specimen by means of an electron microscope, a method for detection of Lorentz deflection of an electron beam transmitting through the specimen (Lorentz electron microscope) or a method for detection of spin polarization of secondary electrons (spin polarization SEM) has been used. Of them, the Lorentz electron microscope is described in, for example, Surface Science, Vol. 13, pp. 525–532 (1992) and the spin polarization SEM is also described in Surface Science, Vol. 13, pp. 512–527 (1992).

DISCLOSURE OF INVENTION

Of the above prior arts, the Lorentz electron microscope faces a technical problem that before observation of the specimen, the specimen must be formed in advance into a film thin enough for an electron beam to transmit therethrough. Lorentz deflection of reflection electrons and secondary electrons can be detected (the magnetization state can be observed) without forming the specimen into a thin film but in that case, the change of detection signal due to Lorentz deflection becomes slight, raising a technical problem that full play cannot be given to high spatial resolution inherently owned by the electron microscope.

On the other hand, the aforementioned spin polarization SEM can afford to observe the magnetization state with high resolution without forming the specimen into a thin film but there needs special electron optical system and detector for detection of spin polarization of secondary electrons, raising a technical problem that the apparatus is inevitably complicated and increased in scale. In addition, the signal is sensitive to the surface condition of the specimen, also raising a technical problem that the function of applying the surface cleaning process to the specimen and a vacuum evacuation unit of high performance for maintaining the cleaned surface condition during observation are needed.

The present invention is made to solve the above-described problems and it is an object of the present invention to provide an electron microscope which can perform high-resolution observation of a magnetization state of a specimen without applying the complicated process of thin film forming and surface cleaning to the specimen and which can be simplified in equipment construction.

To accomplish the above object, in the present invention, in place of the electron detecting method of prior art, circularly polarized light, that is, light (an electromagnetic wave) having a polarization plane which rotates about an axis in the propagating direction, generated from an electron beam irradiated part of a specimen, especially, a magnetic specimen is detected. More specifically, an electron microscope comprises means for holding a specimen, means for irradiating an electron beam on the specimen (usually including an electron source and an electron optical system), and means for detecting an electromagnetic wave of circular polarization (so-called circularly polarized light) generated especially from an electron beam irradiated part of the specimen. Preferably, the circularly polarized light detecting means is provided between the specimen holding means (for example, a specimen holder) and the electron optical system of the electron beam irradiating means. Preferably, a power supply for applying a voltage between the specimen (or specimen holding means) and the electron optical system is provided.

In order to increase the generation efficiency of the circularly polarized light, energy of the irradiating electron beam is made to be low, preferably, 100 eV or less. Accordingly, in addition to the function of irradiating an electron beam on a desired part of a specimen as in the ordinary electron microscope, the present invention has the function of decelerating the electron beam to the aforementioned energy range immediately before the electron beam reaches the specimen and the function of detecting, in a specified direction, circularly polarized light generated from the electron beam irradiated part. Detection of the circularly polarized light is carried out by a combination of, for example, a quarter wave plate, a polarizer and a light intensity detector.

When the electron beam is irradiated on a solid specimen, electrons in the solid specimen are excited either to move to a higher energy level or to be emitted from the solid specimen. When electrons moved to the higher energy level in the solid specimen return to the original or lower energy level (perform transition), energy corresponding to a difference between these energy levels is emitted (so-called energy relaxation process). As a mode of the energy emission, there is, for example, emission of an electromagnetic wave from the solid specimen. The above phenomenon is utilized to make available a known X-ray microanalyzer for measuring characteristic X-rays of a solid specimen which represent electromagnetic waves generated under the electron beam irradiation on the solid specimen and a known cathode ray luminescence method (cathode luminescence: CL method) for measuring luminescence generated when excited electrons are captured by a localized level in the solid specimen (recombination). In these techniques, an equipment for spectroscopic analysis (energy analysis) of electromagnetic waves generated from the specimen is used.

Incidentally, under the irradiation of the electron beam on the magnetic specimen, some of electrons in the magnetic specimen are excited to a valence electron state at an energy level which is several eV higher than the Fermi level and they have such a nature that when being again returned to the ground state, they emit circularly polarized light in the direction of magnetization (magnetic circular dichroism; MCD). The present invention applies this nature to high resolution observation of a magnetization state of the specimen and features measurement of a circular polarization (circularly polarized light) of electromagnetic waves generated from the specimen.

Some of electrons in the magnetic specimen irradiated with the electron beam are excited to an energy level other than the valence electron state (for example, excited to plasmon) and the individual modes of excitation are liable to occur depending on the energy of the irradiated electron beam (for example, a voltage for accelerating the electron beam from the electron source toward the specimen). Accordingly, by lowering the energy of the irradiating electron beam to, preferably, 100 eV or less as described previously to suppress excitation of higher energy than valence electron excitation (excitation to other states than the valence electron state) including the plasmon excitation, circularly polarized light due to MCD can be generated highly efficiently from the electron beam irradiated part.

The circularly polarized light generated by such a mechanism as above is a light ray of several eV in terms of photon energy, that is, in the range of from infrared to ultraviolet. Accordingly, its intensity can be detected easily by first changing the circularly polarized light to linearly polarized light by means of the quarter wave plate and then guiding the linearly polarized light to a photodiode or photomultiplier tube through a polarizer. With the quarter wave plate and polarizer provided in the optical system for detecting the circularly polarized light, linearly polarized light in light rays which act as background noise on the magnetization state measurement of the specimen can be changed, by means of the quarter wave plate, to circularly polarized light and can be shielded (prevented from coming into the detector) by the polarizer.

The intensity of the thus obtained circularly polarized light (namely, a light ray having magnetization state information of the specimen) is maximized when the direction of magnetization in the electron beam irradiated part coincides with the detecting direction and is decreased as the direction of magnetization deviates from the detecting direction. Accordingly, by observing a scanning image in the form of a luminance signal indicative of the circularly polarized light intensity while scanning the electron beam irradiated part on the surface of the specimen, a state of distribution of magnetization can be known.

Needless to say, the specimen is not required to be formed into a thin film for the purpose of detection of the circularly polarized light. Further, since the emission of the circularly polarized light is not affected by details of the surface condition, the highly graded surface cleaning process is not needed. In addition, the aforementioned simplified optical system suffices for detection of the circularly polarized light and hence, the apparatus will not be increased in scale and remarkably complicated by the incorporation of the optical system. As a result, the electron optical system for irradiating the electron beam on the specimen can be of the construction optimized for realization of high resolution.

As described above, according to the present invention, high-resolution observation of the magnetization state can be ensured with the simplified equipment construction without applying to the specimen any special process for observation. And besides, the number of units to be added for the observation to the electron microscope is small and therefore, compatibility with the other observing function which is expected from the ordinary electron microscope is facilitated.

BEST MODE FOR CARRYING OUT THE INVENTION

Figure 1:
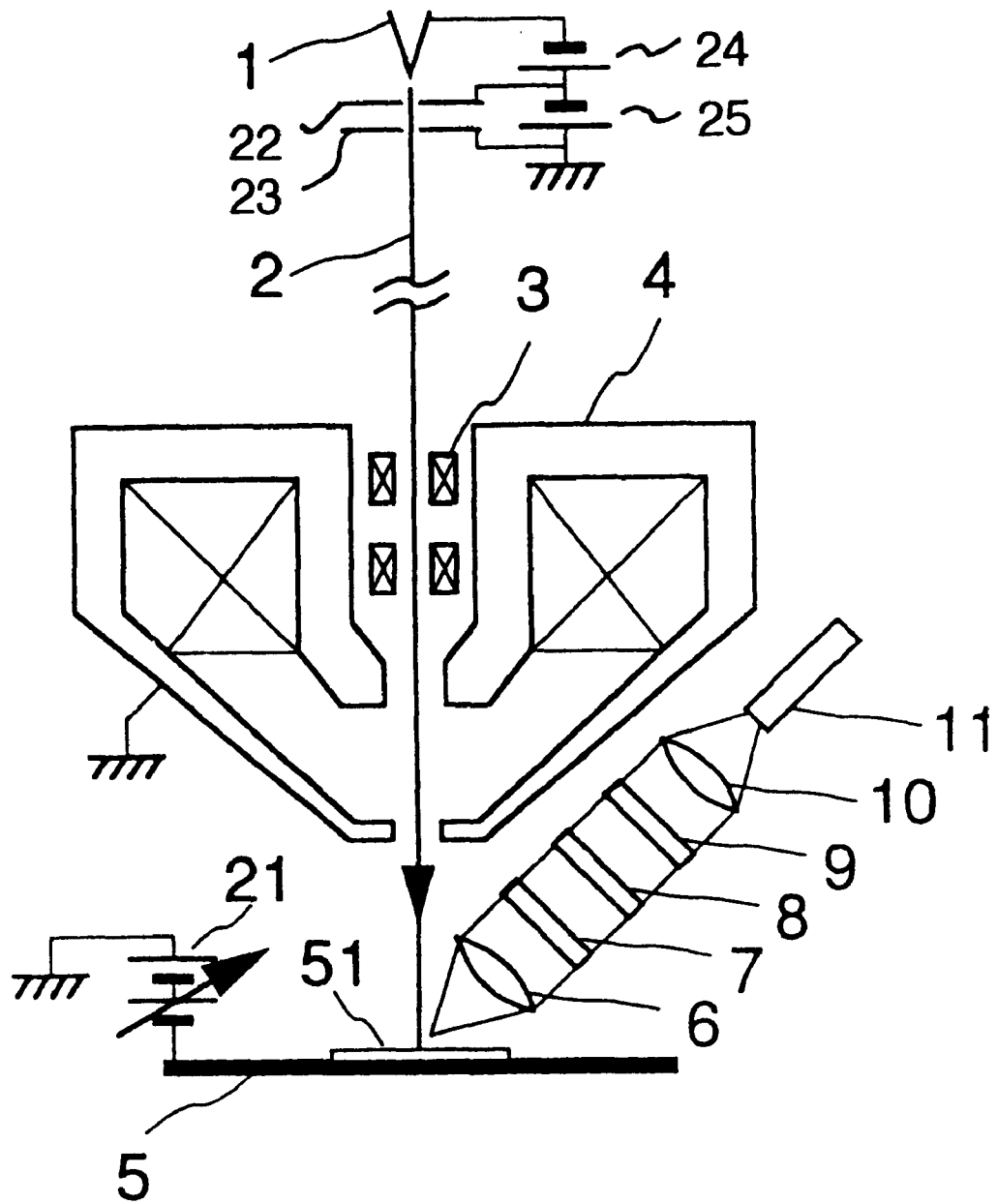
FIG. 1 is a diagram for explaining a first embodiment of the present invention.

The present invention will be described hereinafter in greater detail by referring to embodiments shown in the drawings. It is to be noted that identical reference numerals in FIGS. 1 to 15 denote identical or similar components.

FIG. 1 is a diagram showing the construction of an essential part of a first embodiment of the present invention. In the figure, an electron beam 2 emitted from an electron source 1 and accelerated to 20 keV by electron lenses 22 and 23 is directed to a specimen 51 held on a specimen holder 5 through an electron optical system including a scanning coil 3 and an objective lens 4 which are illustrated in simplified form in the figure. The specimen 51 is held on the specimen holder 5 in either placing or holding manner. The electron source 1 is applied with a high voltage of –20 keV relative to the succeeding electron lens 23 at earth potential by means of power supplies 24 and 25. Accelerating energy of the electron beam 2 is determined by a potential difference between electron source 1 and electron lens 23 which is set by these power supplies 24 and 25, and a value other than 20 keV (for example, a desired value lying between 1 and 50 keV) can also be used. The electron beam 2 is decelerated immediately before reaching the specimen holder 5 by means of a unit 21 for applying potential between the objective lens 4 (earth potential) and the specimen holder 5 and is irradiated, at energy which is set to a desired level of 200 eV or less, on the specimen 51 placed on the specimen holder 5. In this manner, even when the energy of the electron beam 2 incident upon the specimen 51 on the specimen holder 5 is low, the electron beam 2 emitted from the electron source 1 is once accelerated to higher energy than the incident energy so as to be passed through the electron optical system and is then decelerated to a desired energy level immediately before the incidence upon the specimen 51. This is a well-known technique for performing high-resolution observation by focusing the electron beam 2 to a thin beam.

Light emitted from a part of specimen 51 upon which the electron beam 2 is incident is collected by a condenser lens 6 and then passed sequentially through an interference filter 7, a quarter wave plate 8 and a polarizer 9 before reaching a photodetector 11 via a focusing lens 10. In the present embodiment, an avalanche diode is used as the photodetector 11 but another photodetector such as a photomultiplier tube or a CCD may be used. Further, in the present embodiment, an interference filter 7 having bandwidth of 50 nm is ordinarily used by closing the appropriate one in accordance with a wavelength of light to be detected. But, depending on the allowable range of wavelength of the light to be detected, an interference filter of anther bandwidth may be used or sometimes, wavelength selection is unneeded and no interference filter is used.

Figure 2:
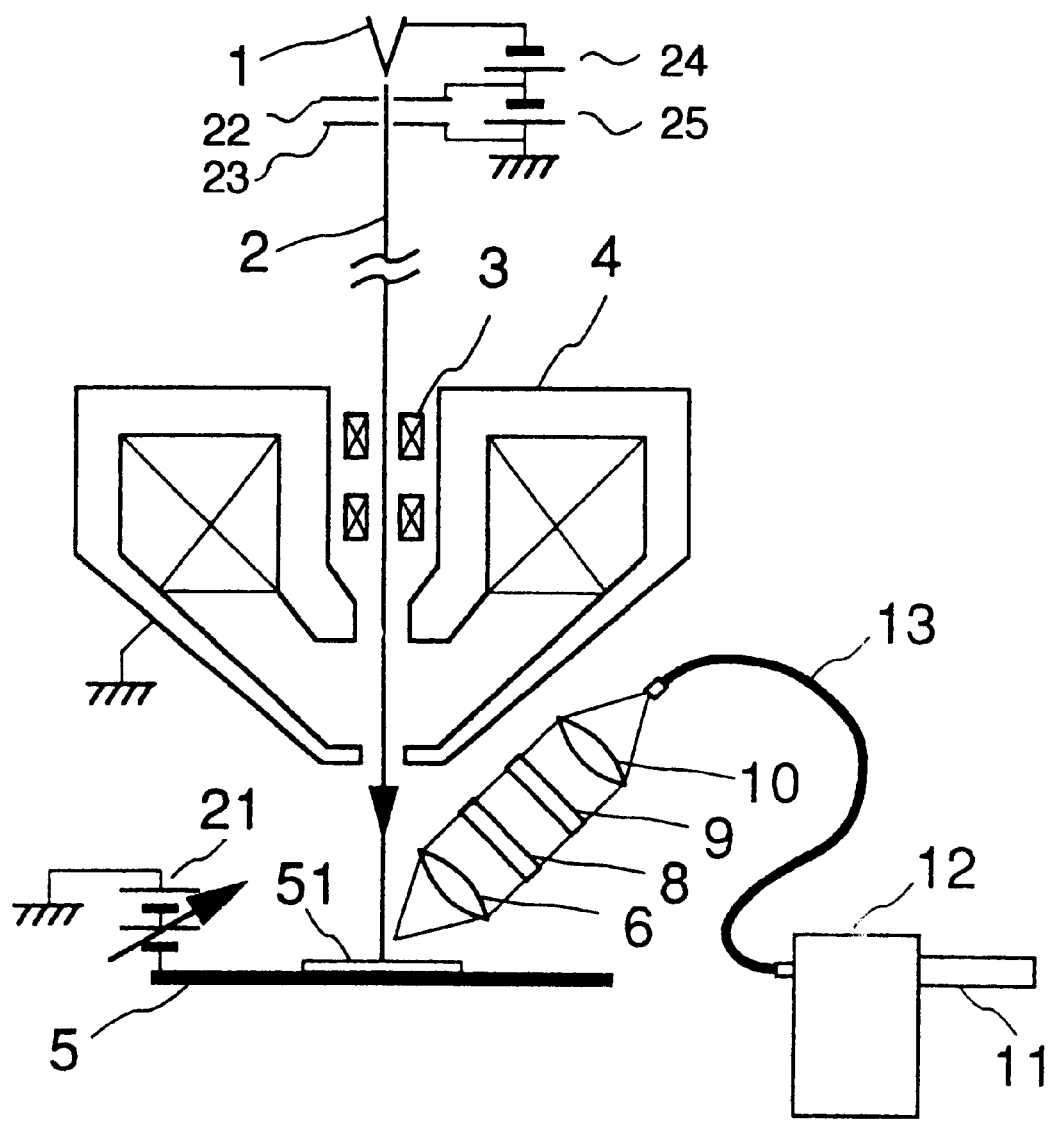
FIG. 2 is a diagram for explaining a second embodiment of the present invention.

When strict wavelength selection is necessary, a spectrometer 12 carrying a prism and a diffraction grating is utilized in place of the interference filter 7 as shown in a second embodiment of the present invention illustrated in FIG. 2. In this case, a condenser lens 6, a quarter wave plate 8, a polarizer 9, a focusing lens 10, the spectrometer 12 and a photodetector 11 are arranged in this order to constitute a circularly polarized light detecting system. By using the spectrometer 12 in the circularly polarized light detecting system, an advantage that the exchange of interference filter 7 to conform with a wavelength of light is not necessary can be attained. Incidentally, when the spectrometer 12 is used to constitute the circularly polarized light detecting system, a resulting system is more increased in occupation volume than the circularly polarized light detecting system using the interference filter 7. Then, if this matters, the light from the focusing lens 10 will once be guided to an optical fiber 13 so as to be transmitted to the spectrometer 12 installed at a location free from spatial restriction as in the case of the present embodiment shown in FIG. 2.

The provision of a wavelength selecting means such as interference filter 7 and spectrometer 12 in a light detecting means for detection of light from the specimen 51 is effective for suppressing noise in detection of circularly polarized light of a desired (measuring object) especially when the light generated from the specimen 51 contains light rays of various wavelengths. When the circularly polarized light has a wavelength equal or nearly equal to that of the other light (so-called noise), the two light rays can be separated from each other by means of the quarter wave plate 8 and polarizer 9. But, when circularly polarized light of the measuring object and light of a wavelength different from that of the circularly polarized light are emitted from the specimen 51, the light of different wavelength cannot be separated from the circularly polarized light of measuring object by means of the quarter wave plate 8 and polarizer 9 regardless of the light of different wavelength being of a linear polarization or a circular polarization. This is because the function of converting a linear polarization into a circular polarization or vice versa depends on a wavelength passing through the wave plate.

Figure 3:
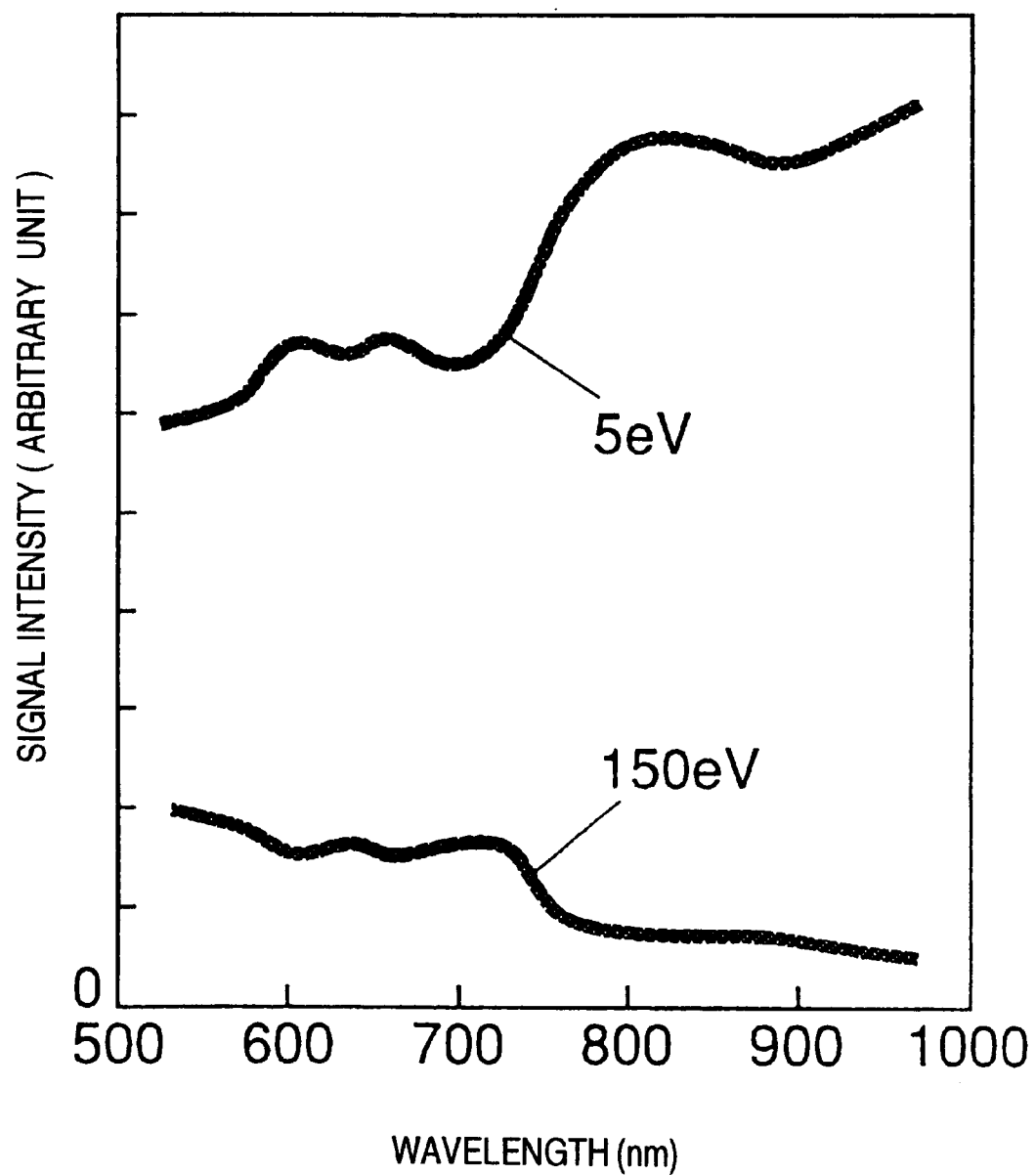
FIG. 3 is a diagram for explaining application examples of the first or second embodiment.

Next, measurement examples by the first embodiment of the present invention shown in FIG. 1 or the second embodiment of the present invention shown in FIG. 2 will be depicted in FIG. 3. FIG. 3 graphically illustrates results of measurement of dependency of the signal intensity upon the wavelength of circularly polarized light when a cobalt (0001) thin film epitaxially grown on a gold substrate is used as specimen 51 and energy of the electron beam 2 incident on the specimen 51 is 5 eV and 150 eV. It should be noted that the signal intensity in FIG. 3 is normalized by current of the electron beam 2 incident on the specimen 51 and luminescent efficiency at individual wavelengths. As is clear from FIG. 3, the dependency of the signal intensity upon the wavelength differs with different incident energy levels of the electron beam 2 and the average signal intensity for an incident energy level of 150 eV of the electron beam 2 is only a fraction of that for 5 eV. This is because as the incident energy of the electron beam 2 increases, excitation to higher energy than valence electron excitation, such as plasmon excitation, becomes active and the efficiency of generation of circularly polarized light due to MCD is decreased. Accordingly, it has been proven that the incident energy of the electron beam 2 is 100 eV or less and more preferably, 10 eV or less.

Figure 4:
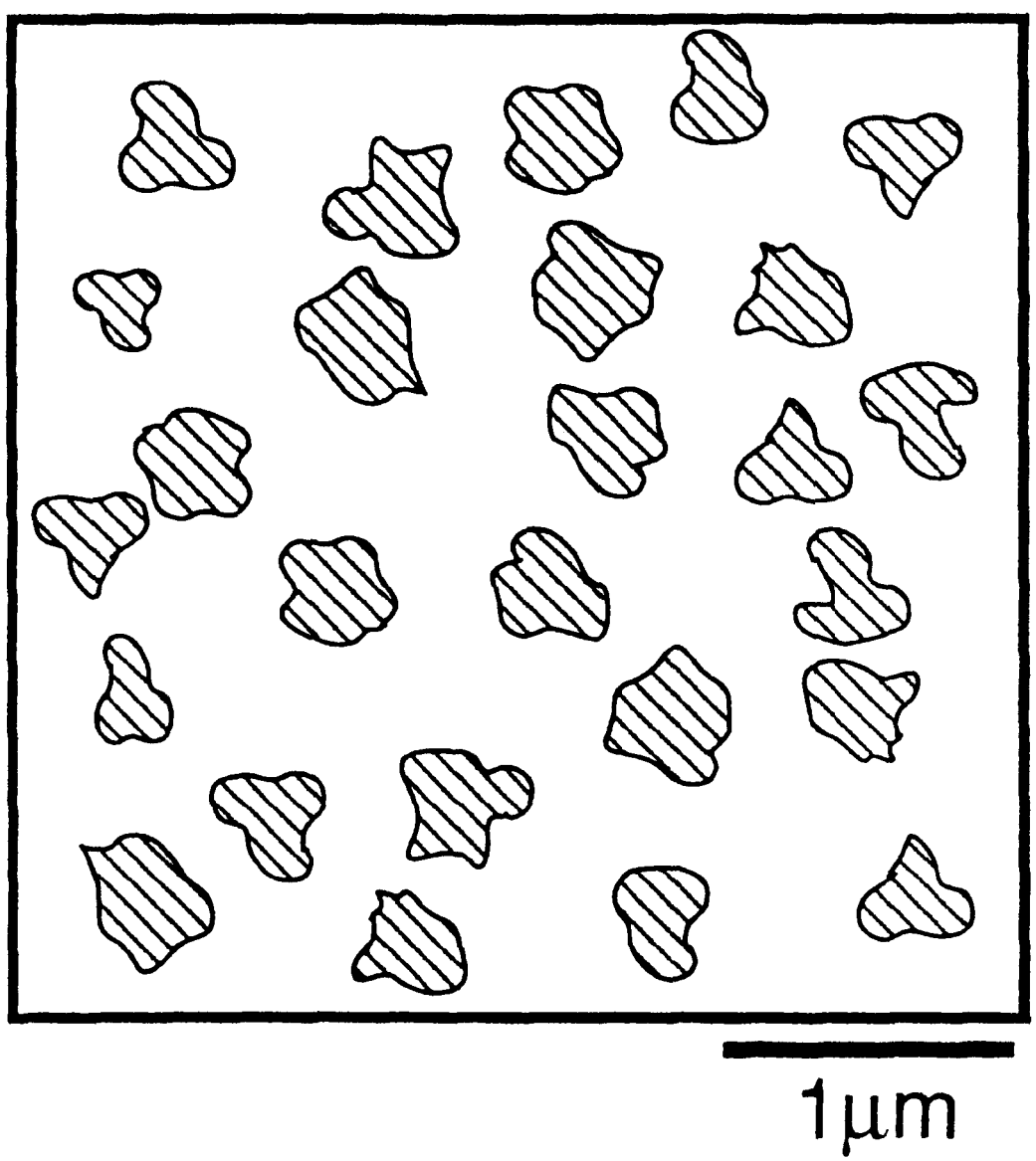
FIG. 4 is a diagram for explaining an application example of the first or second embodiment of the present invention.

Next, results of observation of scanning images performed using a cobalt (0001) thin film epitaxially grown on a gold substrate as the specimen 51, as in the case of FIG. 3, in accordance with the first embodiment of the present invention shown in FIG. 1 and the second embodiment of the present invention shown in FIG. 2 are diagrammatically shown in FIG. 4. Incident energy of the electron beam 2 is set to 10 ev. Contrast of images in FIG. 4 represents the normalized intensity of circularly polarized light at individual locations, that is, the component of magnetic moment in the observation direction, demonstrating that distribution of magnetization states of the specimen 51 is captured as images.

Figure 5:
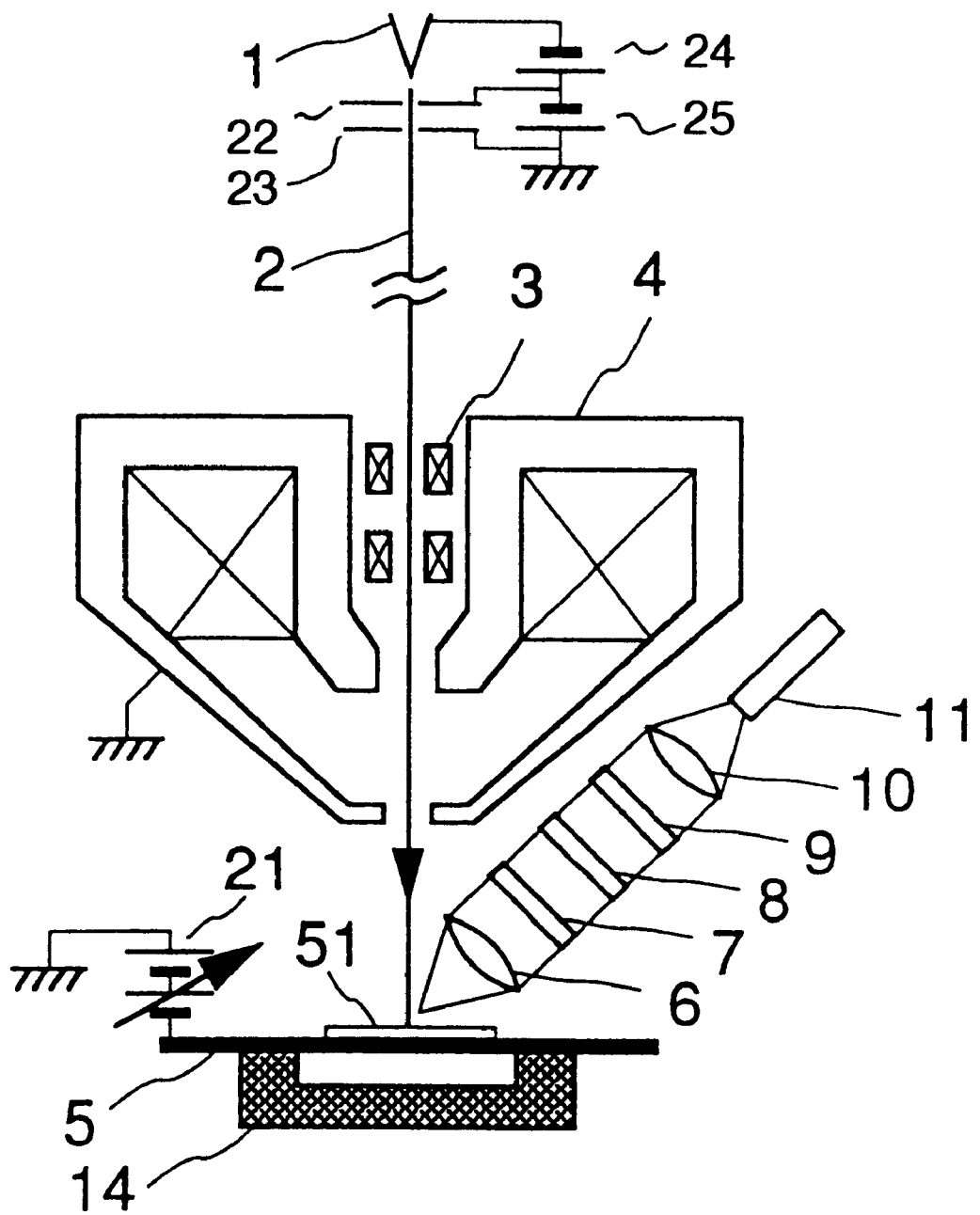
FIG. 5 is a diagram for explaining a third embodiment of the present invention.
Figure 6:
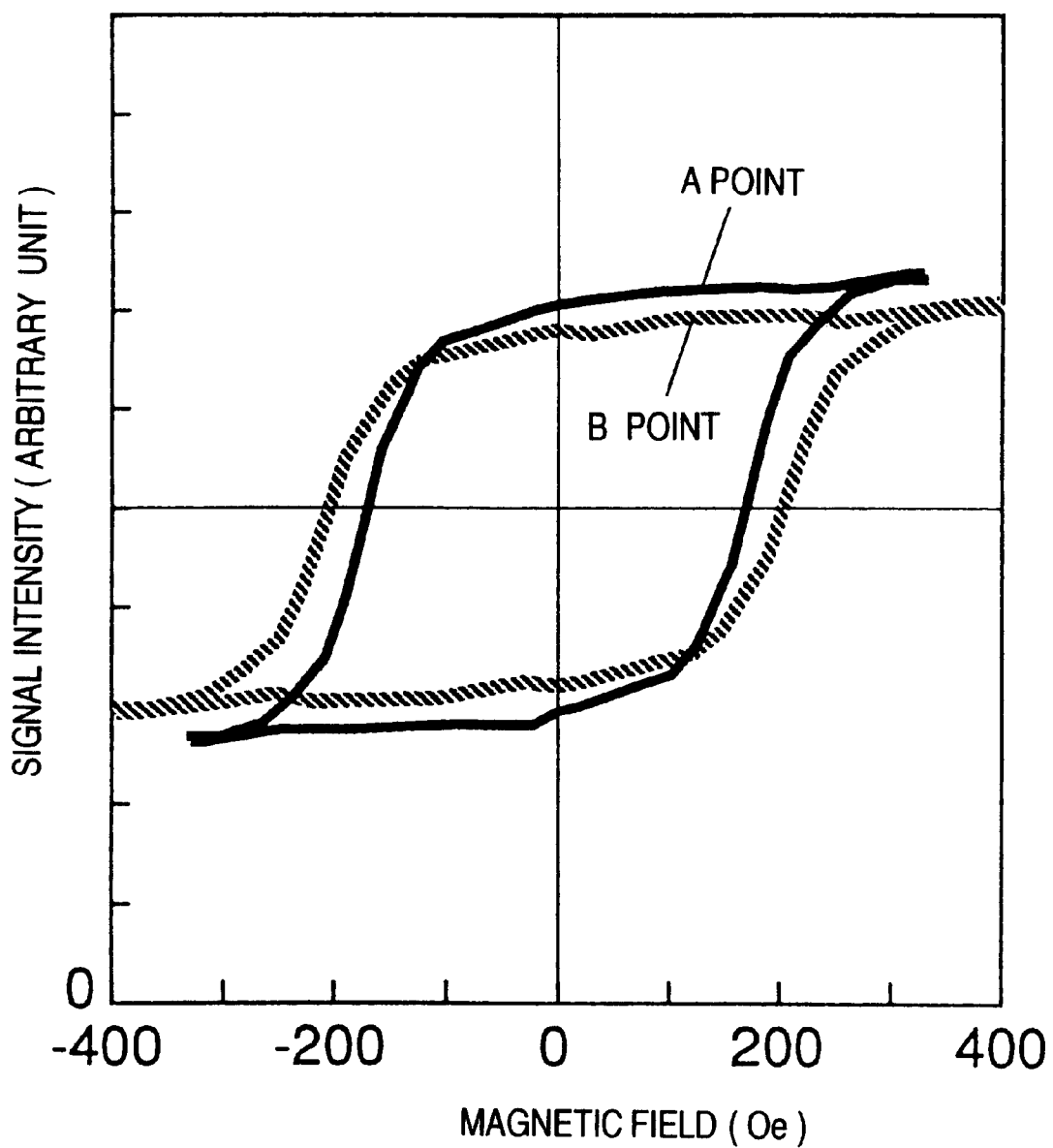
FIG. 6 is a diagram for explaining application examples of the third embodiment of the present invention.

Next, a third embodiment of the present invention will be described with reference to FIG. 5. In FIG. 5, a magnetic field applying unit 14 for permitting application of a controlled external magnetic field to the specimen 51 is added to the construction of the first embodiment of the present invention described with reference to FIG. 1. With this construction, a response of the magnetization state to the external magnetic field can be measured at individual parts of the specimen 51. FIG. 6 shows results of measurement at two points on the specimen 51 (shown as points A and B in FIG. 6) carried out using, as the specimen 51, a polycrystal cobalt thin film grown on a chromium underlayer through spattering process. As is clear from measurement examples of FIG. 6, a local magnetization curve can be obtained at a desired location on the specimen 51 according to the third embodiment of the present invention shown in FIG. 5.

Figure 7:
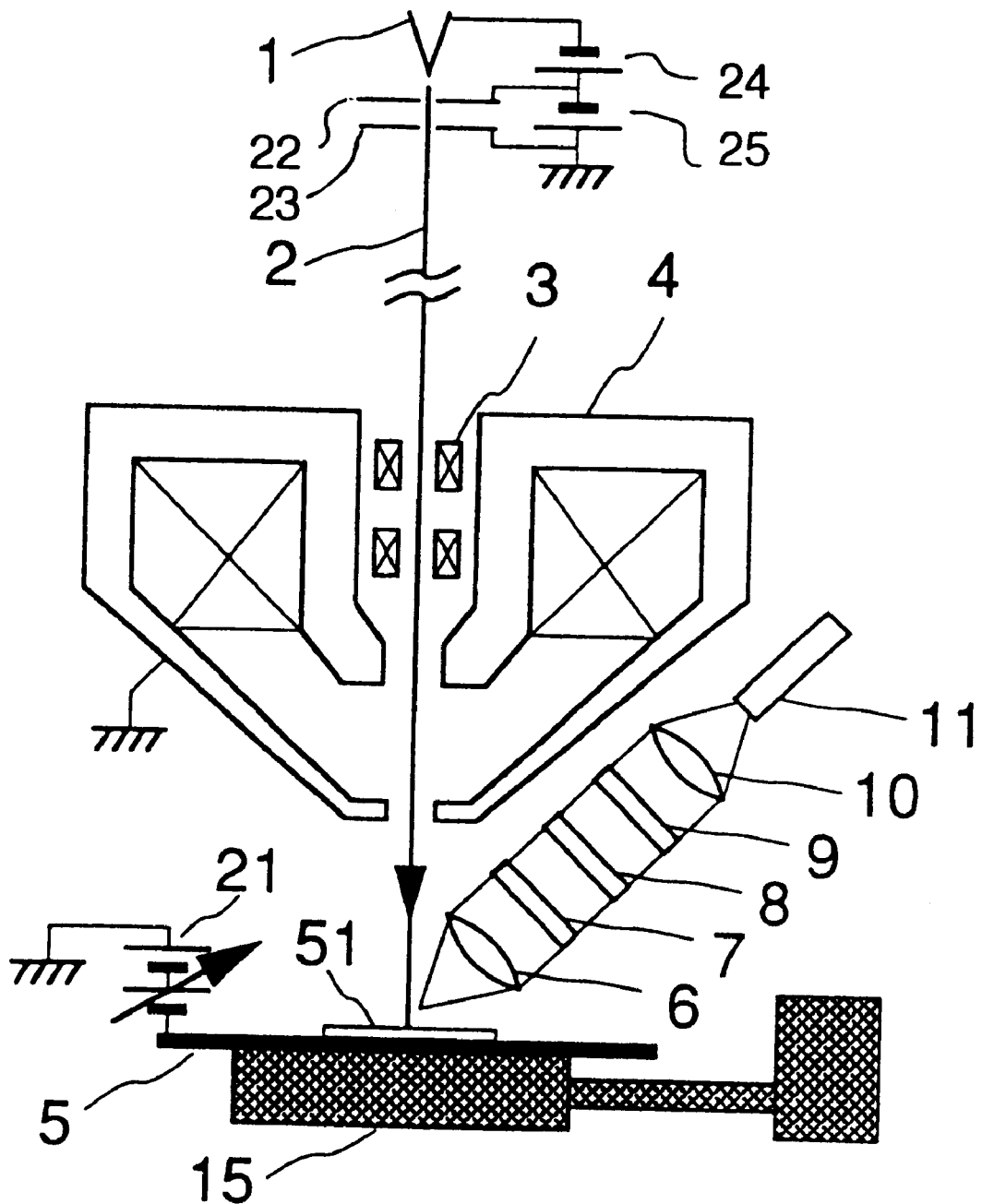
FIG. 7 is a diagram for explaining a fourth embodiment of the present invention.
Figure 8:
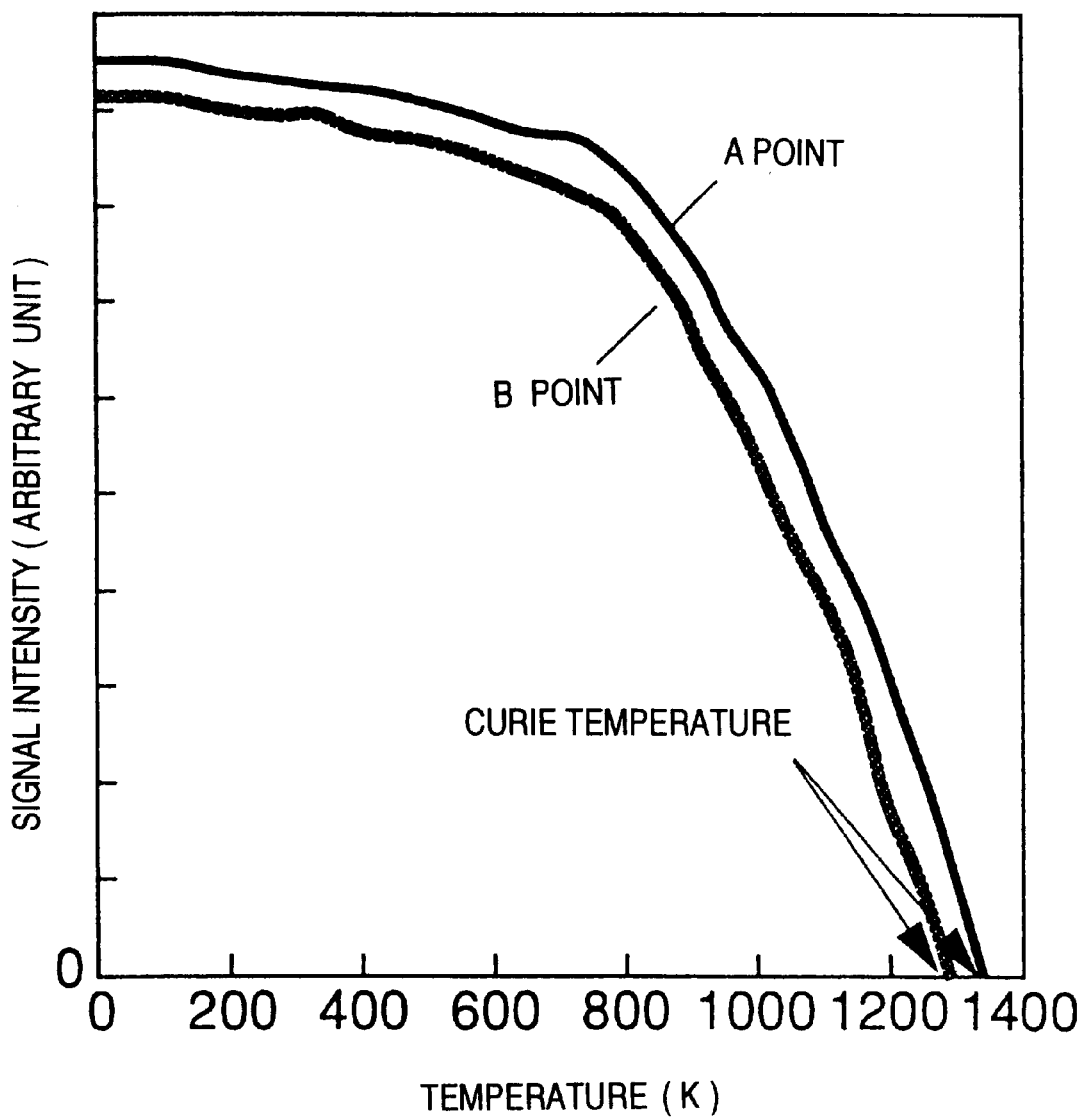
FIG. 8 is a diagram for explaining application examples of the fourth embodiment.

Next, a fourth embodiment of the present invention will be described with reference to FIG. 7. In FIG. 7, a temperature controlling unit 15 capable of setting the specimen 51 at a predetermined temperature is added to the construction of the first embodiment of the present invention described with reference to FIG. 1. With this construction, dependency of the magnetization state upon temperatures can be measured at individual parts of the specimen 51. FIG. 8 shows results of measurement at two points on the specimen 51 (shown as points A and B in FIG. 8) carried out using, as the specimen 51, a polycrystal cobalt thin film grown on a chromium underlayer through spattering process as in the case of FIG. 6. As is clear from the measurement examples of FIG. 8, temperature characteristics of the magnetization state including Curie temperature at desired locations on the specimen 51 can be obtained according to the embodiment of the present invention shown in FIG. 7.

Figure 9:
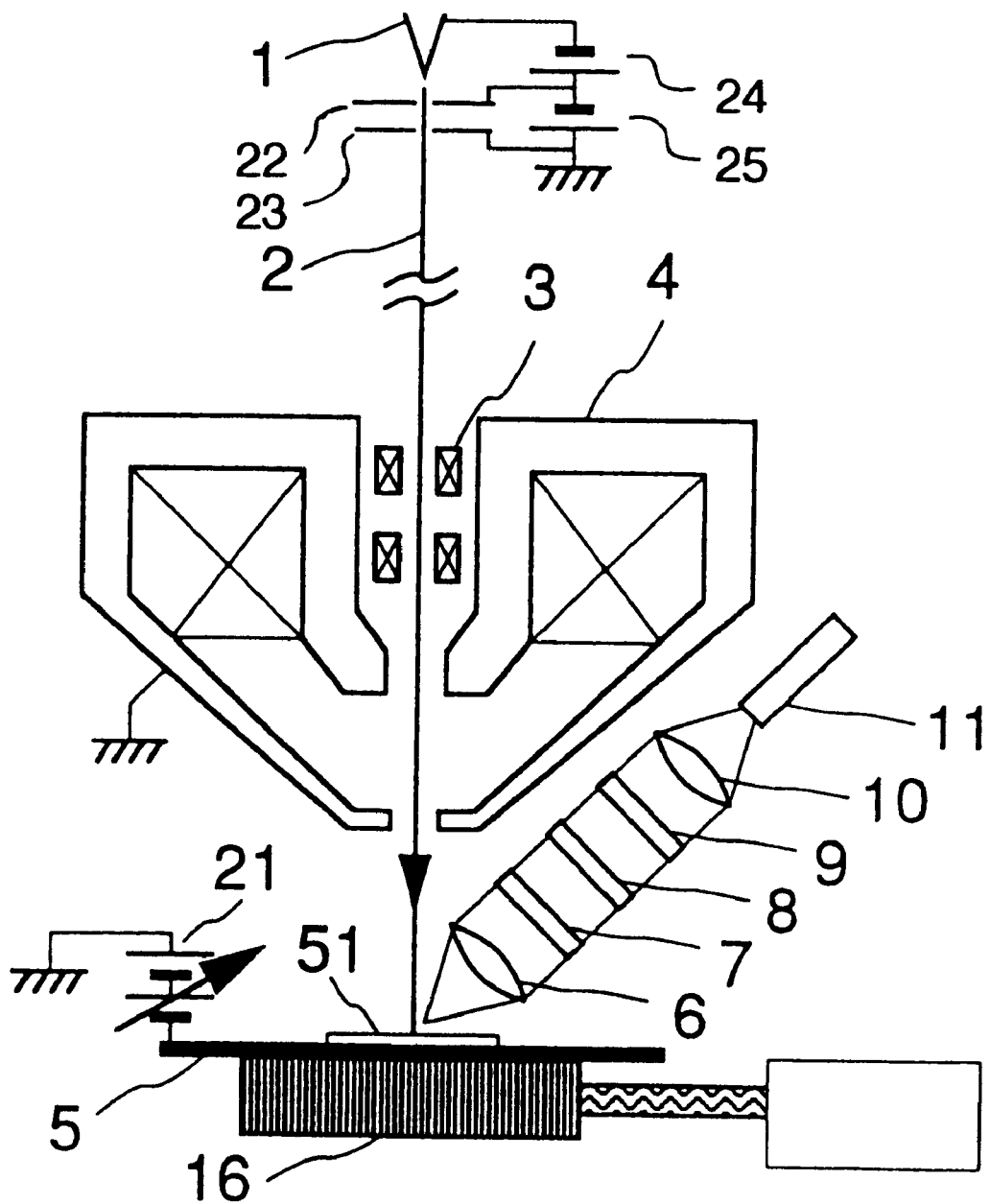
FIG. 9 is a diagram for explaining a fifth embodiment of the present invention.

Next, a fifth embodiment of the present invention will be described with reference to FIG. 9. In FIG. 9, a specimen scanning unit 16 comprised of a piezo-actuator is added to the construction of the first embodiment of the present invention described with reference to FIG. 1. This ensures that a scanning image in the form of a luminance signal indicative of a signal from the photodetector 11 can be obtained by not only a method of scan-moving the electron beam 2 on the surface of specimen holder 5 by means of the scanning coil 3 but also a method of scan-moving the specimen holder 5 in relation to the electron beam 2. In the fifth embodiment of the present invention shown in FIG. 9, a point at which circularly polarized light is generated can always be immobile by scanning the specimen holder 5 without performing scanning of the electron beam 2, thereby attaining an advantage that the detection accuracy of the intensity of circularly polarized light can be improved. In the case of scanning (movement) of the specimen holder 5, the luminance signal is fetched in correspondence to, preferably, in synchronism with the scanning of the specimen holder 5. This resembles the fetching of the luminance signal carried out in correspondence to the scanning of the electron beam 2 when the electron beam 2 is scanned.

To obtain the magnetization state distribution in the form of images, still another method (circularly polarized light imaging method) can also be considered in which the electron beam 2 is irradiated on the whole observation area of the specimen 51 while not being focused and the optical system for detection of circularly polarized light is used as an imaging system to image the intensity of circularly polarized light at individual parts of an image. Substitution of an imaging type device such as for example a CCD (charge coupled device) for the photodetector 11 suffices for this purpose and besides, the electron optical system can be more simplified than that of the embodiments of the present invention which have been set forth so far or can be dispensed with thoroughly. But the resolution of images obtained through this circularly polarized light imaging method is prescribed by the wavelength of detected light and therefore, resolution comparable to that obtained through the method of obtaining images by focusing the electron beam cannot be accomplished. Accordingly, it is desirable that the circularly polarized light imaging method be used only when observation of the magnetization state distribution is desired to be carried out in a simple way by using an apparatus of compact construction.

Figure 10:
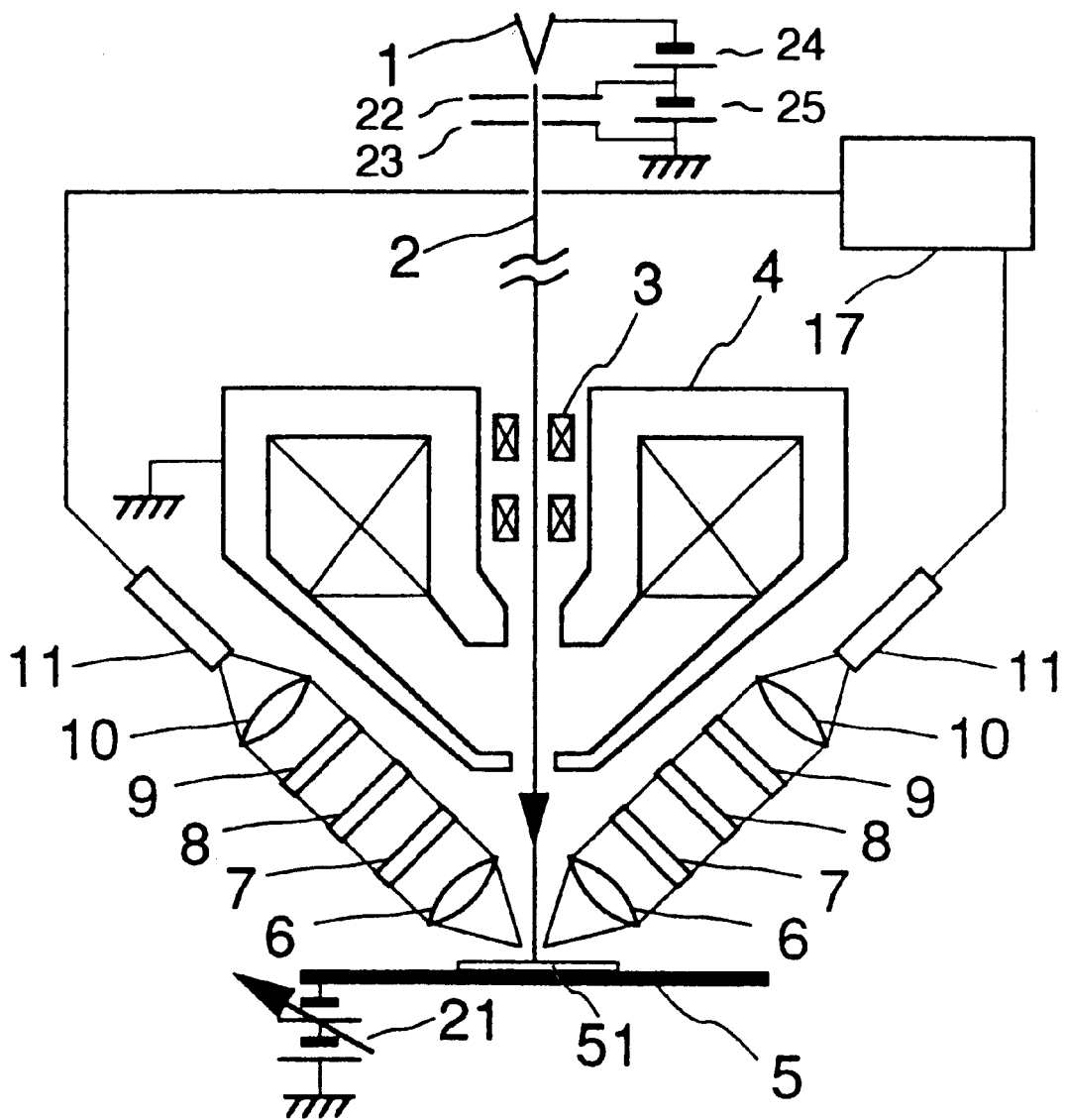
FIG. 10 is a diagram for explaining a sixth embodiment of the present invention.

Next, a sixth embodiment of the present invention will be described with reference to FIG. 10. In FIG. 10, to the construction of the first embodiment of the present invention described with reference to FIG. 1, another circularly polarized light detecting system including a combination of a condenser lens 6, an interference filter 7, a quarter wave plate 8, a polarizer 9, a focusing lens 10 and a photodetector 11 is additionally provided and at the same time, an numerical processing unit 17 capable of concurrently operating signals from the plurality of circularly polarized light detecting systems is added. By the sixth embodiment, a scanning image in the form of a luminance signal indicative of an operation result by the numerical processing unit 17 can be obtained. In FIG. 10, only the two circularly polarized light detecting systems are depicted only for convenience of illustration but actually, four circularly polarized light detecting systems are used in the sixth embodiment. Obviously, the number of the circularly polarized light detecting systems can be changed as necessary.

Figure 11:
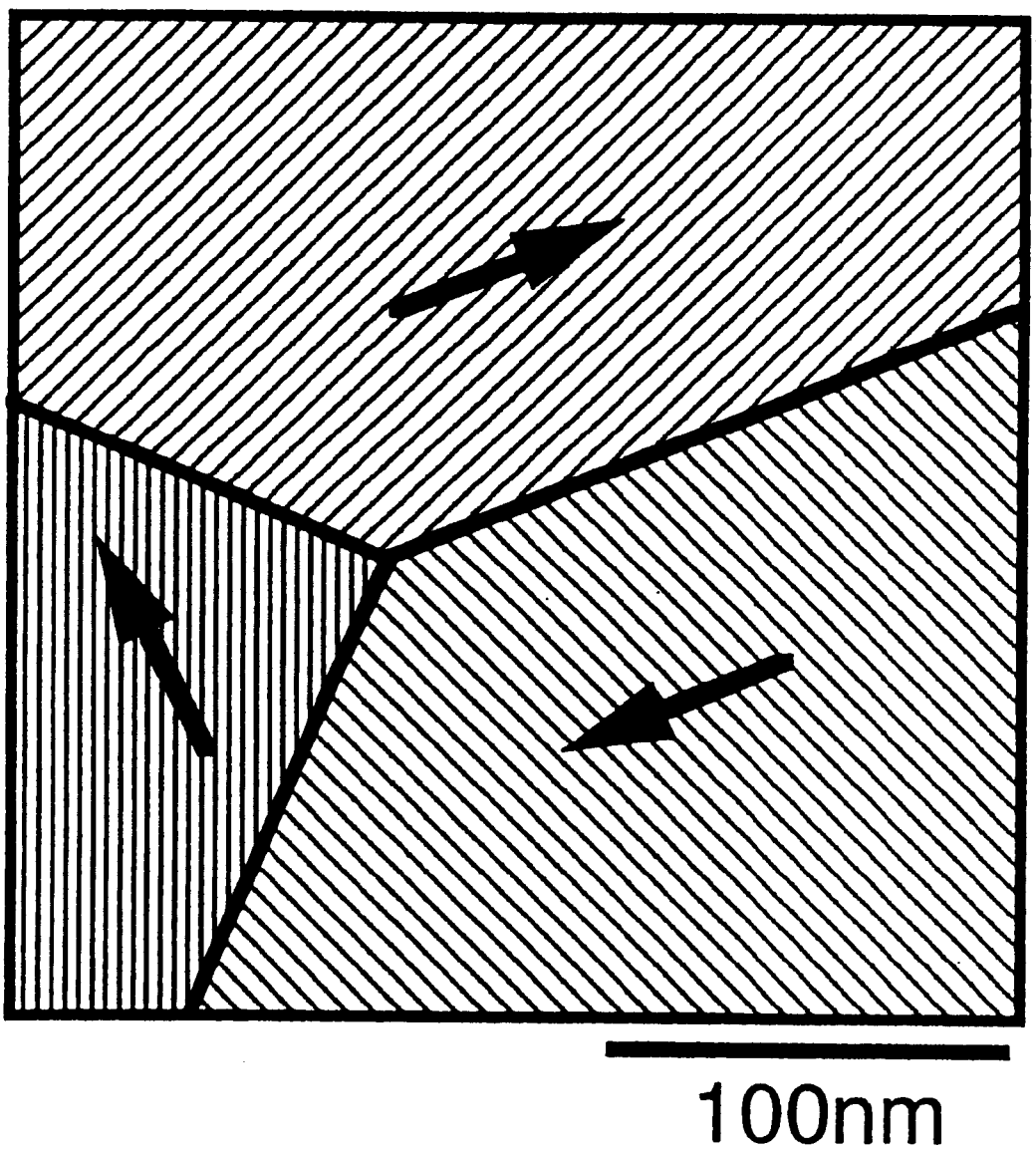
FIG. 11 is a diagram for explaining an application example of the sixth embodiment of the present invention.

In the first to fifth embodiments of the present invention set forth so far, information about a magnetization component in the direction of the circularly polarized light detecting system is provided but according to the sixth embodiment of the present invention shown in FIG. 10, distribution of directions of magnetization can be known in greater detail by changing the method of operation by the numerical processing unit 17. FIG. 11 diagrammatically shows results of observation carried out using iron single crystal as the specimen 51. As is clear from an observation example of FIG. 11, according to the sixth embodiment of the present invention shown in FIG. 10, the magnetization state of the specimen 51 can be obtained in combination with magnetization directions. It should be noted that the method of obtaining a luminance signal of a scanning image by applying the numerical processing process to signals from the plurality of circularly polarized light detecting systems can obviously be applied not only to the sixth embodiment of the present invention described with reference to FIG. 10 in which the electron beam 2 is scanned but also to the fifth embodiment of the present invention described with reference to FIG. 9 in which the specimen holder 5 is scanned.

Figure 12:
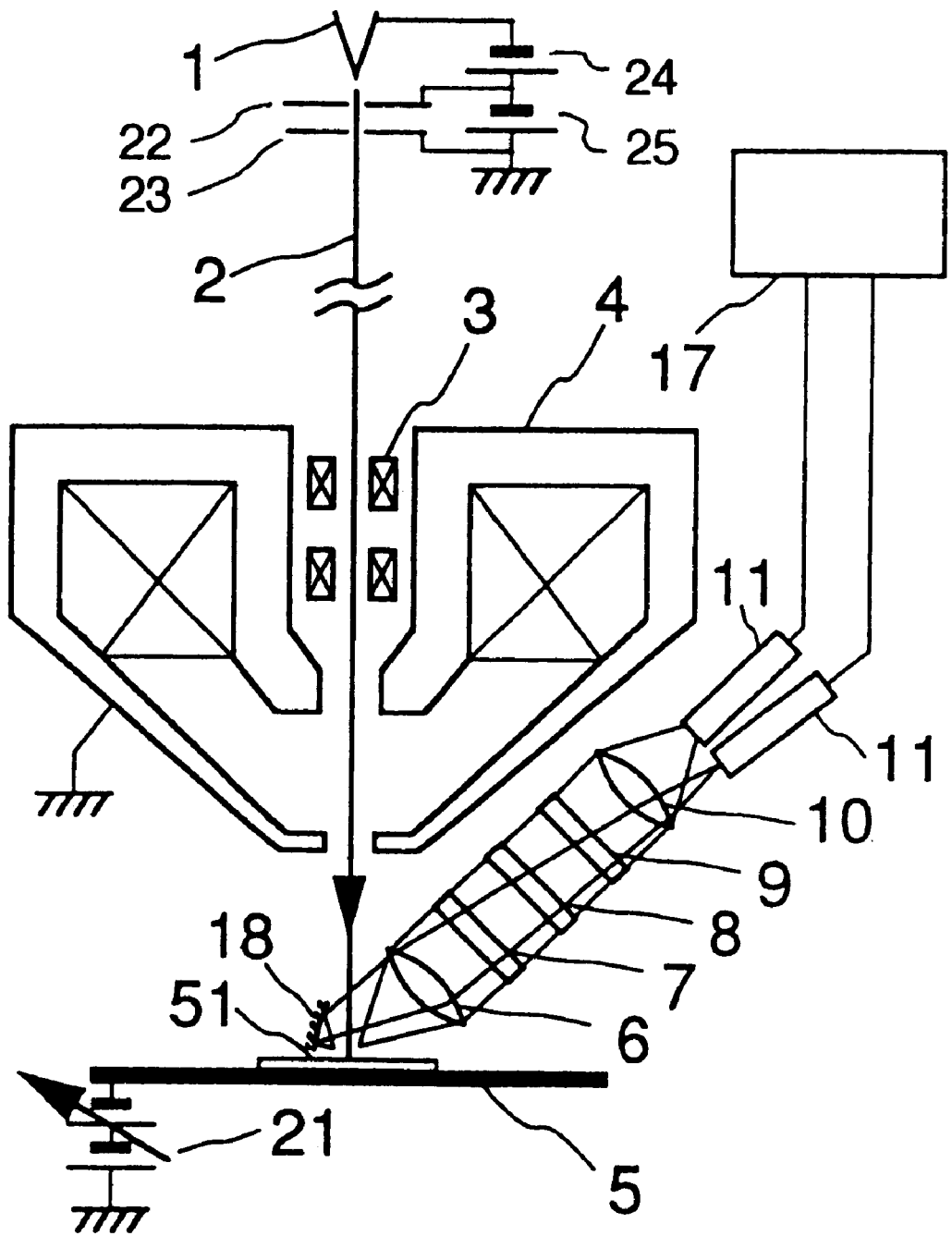
FIG. 12 is a diagram for explaining a seventh embodiment of the present invention.

Next, a seventh embodiment of the present invention will be described with reference to FIG. 12. In FIG. 12, instead of adding the circularly polarized light detecting system as in the sixth embodiment of the present invention described with reference to FIG. 10, a reflection mirror 18 is provided and reflection light therefrom is guided to a condenser lens 6. Here, by making a light path for circularly polarized light from the reflection mirror 18 different from that for circularly polarized light incident directly on the condenser lens 6 in the circularly polarized light detecting system, the two circularly polarized light rays can be detected by different photodetectors 11. By processing signals obtained from these photodetectors 11 by means of an numerical processing unit 17, observation images similar to those in the sixth embodiment of the present invention described with reference to FIG. 10 can be obtained.

For the light collecting method using the reflection mirror 18 as in the seventh embodiment of the present invention shown in FIG. 12, various kinds of construction other than that of the seventh embodiment can be conceived. The number of the optical element such as the condenser lens 6 or the reflection mirror 18 for collecting light from the specimen 51 may be increased as necessary. In this case, a photodetector 11 is provided in association with each optical element to form one set of light detecting optical system. In each set of light detecting optical system, it is important that the optical axis of the optical element and associated photodetector be adjusted and set such that light from an optical element of a different set is not incident to that photodetector. In any case, as compared to the construction in which the plurality of circularly polarized light detecting systems are provided as in the sixth embodiment of the present invention shown in FIG. 10, the equipment construction for detection of circularly polarized light can advantageously be compact.

Figure 13:
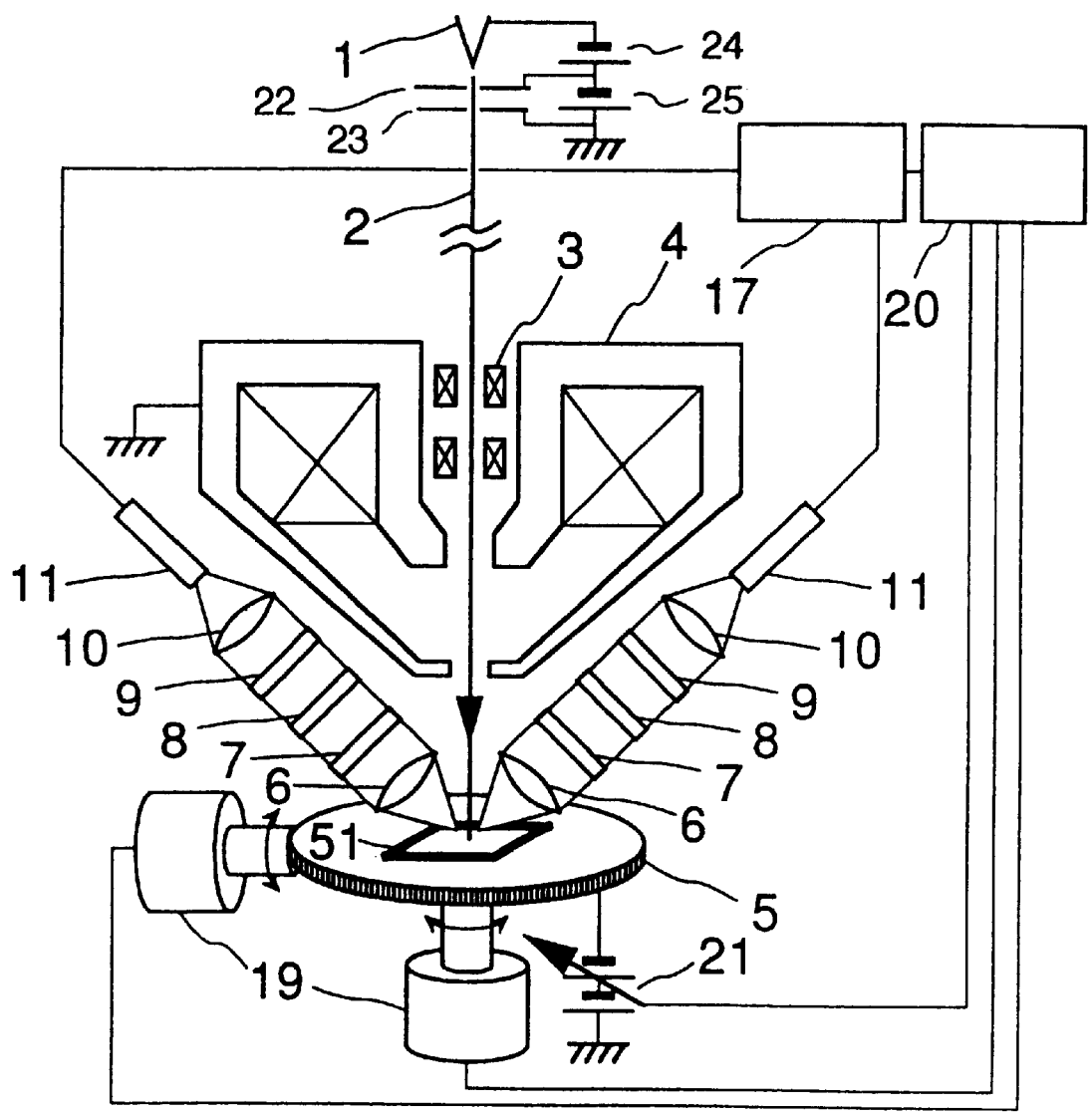
FIG. 13 is a diagram for explaining an eighth embodiment of the present invention.
Figure 14:
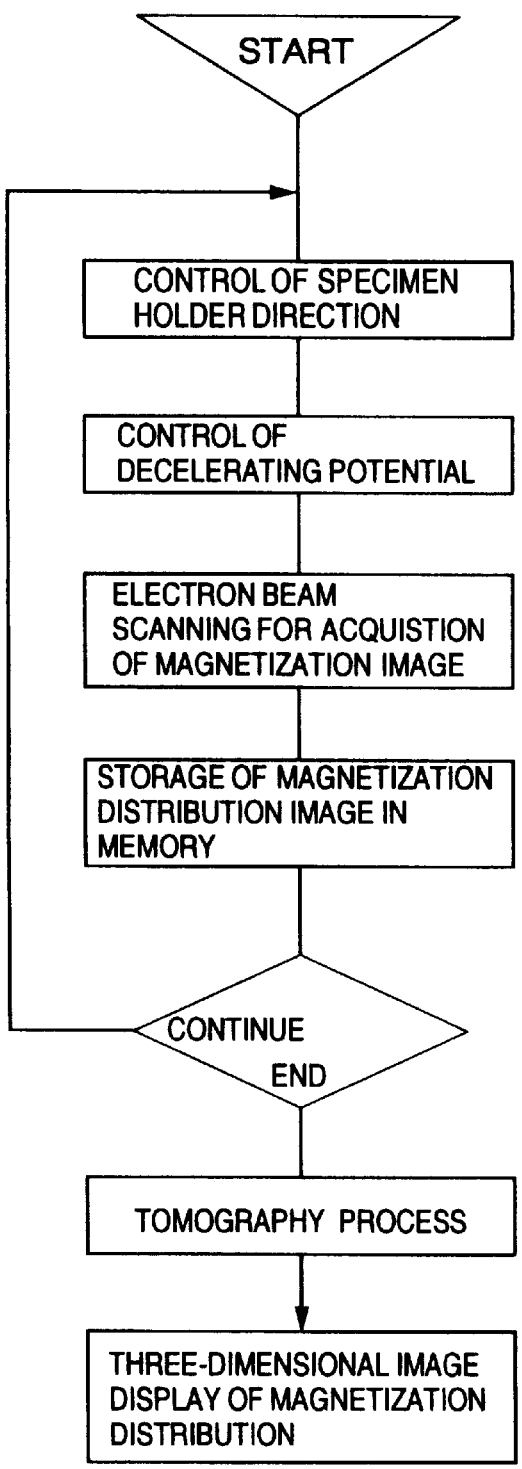
FIG. 14 is a diagram for explaining flow of the processing in the eighth embodiment of the present invention.

Next, an eighth embodiment of the present invention will be described with reference to FIG. 13. In FIG. 13, a rotation unit 19 for applying inclination and rotation to the specimen holder 5 and a controlling/processing unit 20 for controlling the rotation unit 19 and incident energy of electron beam 2 upon the specimen 51 and at the same time, for processing signals from an numerical processing unit 17 is added to the sixth embodiment of the present invention described with reference to FIG. 10. As has already been described with reference to FIG. 3, the efficiency of generation of circularly polarized light strongly depends on the energy of electron beam 2. More specifically, the lower the energy of electron beam 2, the higher the generation efficiency tends to be and therefore, the electron beam 5 being incident on the specimen 51 and penetrating into the interior gradually loses energy and the circularly polarized light generation efficiency is maximized immediately before the stoppage. Through the use of this nature, magnetization information at different depths can be obtained by changing the incident energy of electron beam 2 on the specimen 51. By utilizing this in combination with observation as viewed in various directions based on the rotation unit 19, three-dimensional distribution of magnetization can be obtained through computed tomography (CT) process. To this end, necessary controlling of the direction of the specimen holder 5 and the energy of the electron beam 5 and necessary processing for reconstruction of three-dimensional magnetization distribution by applying the tomography process to obtained data can be carried out with the controlling/processing unit 20 in accordance with the procedure shown in FIG. 14. Thus, according to the eighth embodiment of the present invention, thorough magnetization distribution of the specimen 51 can be obtained.

The equipment construction capable of materializing the present invention is not limited to the previously-described eight embodiments. For example, while in the foregoing embodiments, the circularly polarized light detecting system including a combination of the condenser lens 6, interference filter 7 or spectrometer 12, quarter wave plate 8, polarizer 9, focusing lens 10 and photodetector 11 is used for detection of circularly polarized light but another detector differently constructed can be utilized without impairing the essence of the present invention, provided that it has the function of detecting circularly polarized light. Further, another electron microscope of any construction can obviously be realized without impairing the essence of the present invention, provided that it has the function of detecting circularly polarized light due to MCD generated from a part of specimen 51 irradiated with the electron beam 2.

Figure 15:
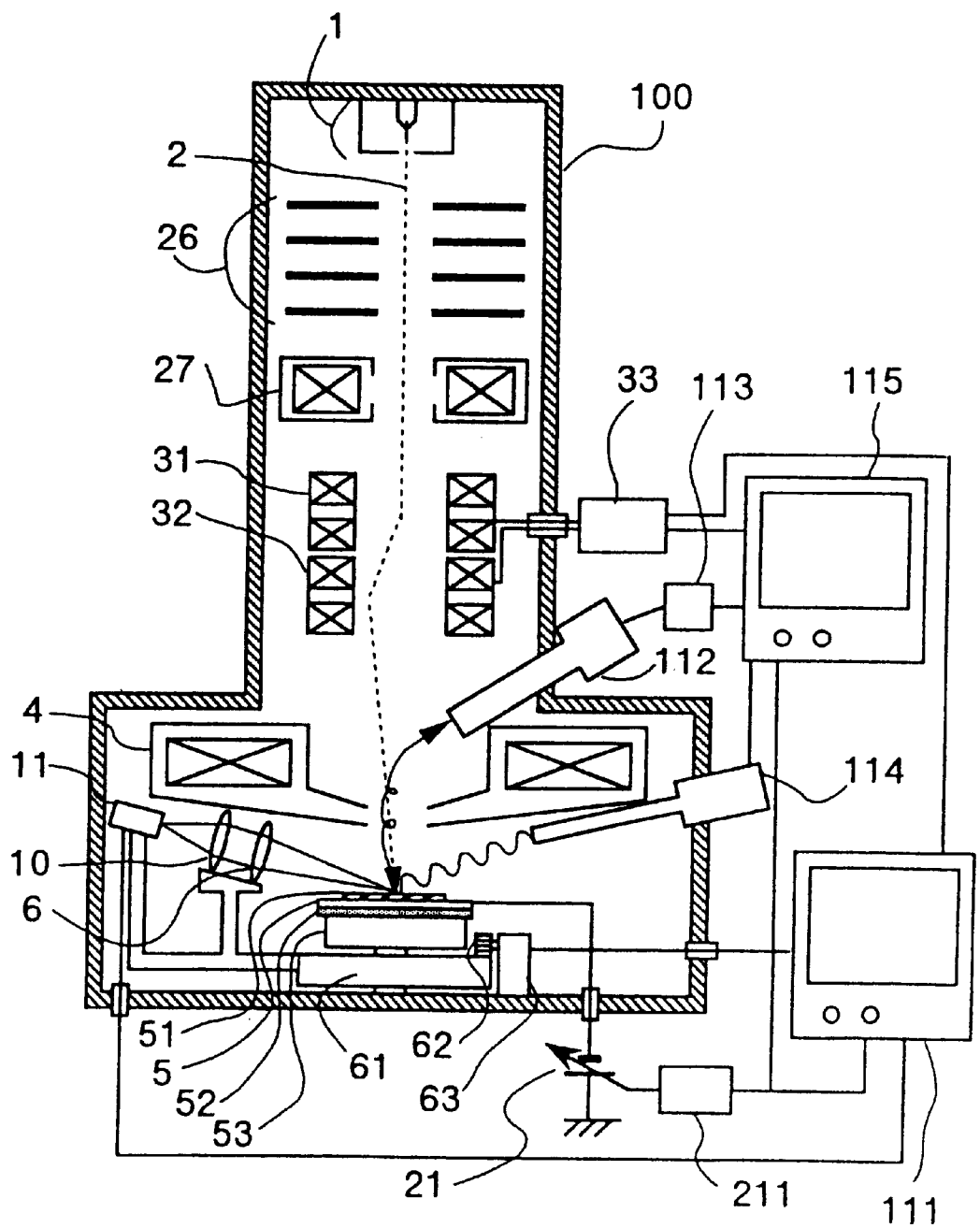
FIG. 15 is a diagram for explaining a ninth embodiment of the present invention.

Finally, FIG. 15 shows, as a ninth embodiment, an apparatus in which the mechanism for measuring a magnetization state of a specimen according to the present invention is carried on a general-purpose scanning electron microscope (so-called SEM). In the SEM, an electron source 1, an electrode group 26 for accelerating an electron beam 2 emitted from the electron source 1, a magnetic lens 27 for focusing the electron beam 2, a deflecting electrode 31 for scanning the electron beam 2 in x direction on the surface (assumed to be xy plane) of a specimen 51 and a deflecting electrode 32 for scanning the electron beam 2 in y direction, an objective lens 4 for irradiating the electron beam 2 on the surface of the specimen 51, a specimen holder on which the specimen is carried, and an XY stage 53 for moving the specimen holder 5 along the xy plane are arranged in a vacuum column 100 as shown in FIG. 15. The deflecting electrodes 31 and 32 are controlled by an electron beam scanning control unit 33 so that the electron beam 2 may be scanned on the surface of the specimen 51. Secondary electrons generated from the specimen 51 under irradiation of the electron beam 2 are detected by an electron detector 112 and a detection signal is amplified by an amplifier 113 and inputted to a signal processing unit (or electronic computer) 115. Further, X-rays (characteristic X-rays) generated from the specimen 51 is detected by an X-ray detector 114 and similarly inputted the signal processing unit 115. The signal processing unit 115 forms a secondary electron image or an X-ray image (so-called SEM image) of the specimen in correspondence to a deflecting electrode control signal from the electron beam scanning control unit 33 and a secondary electron signal or an X-ray signal from the specimen. The above is the well-known basic construction and function of the SEM.

The SEM of FIG. 15 is added with the magnetization state measuring function of the present invention to have structural features as below. A light detecting optical system for measuring light (circularly polarized light) generated from the specimen 51 under irradiation of the electron beam 2 is provided between the objective lens 4 (the final stage of the electron optical system for irradiating the electron beam on the specimen 51) and the specimen holder 5. But the construction of the light detecting optical system is simplified as compared to the previously-described embodiments by including only a condenser lens 6 for collecting light from the surface of the specimen 51, a focusing lens 10 for focusing the collected light, and a the photodetector 11 for detecting the focused light. The optical element and the detector are placed on an arm of an optical system holder 61 which is moved substantially along the outer periphery of the specimen holder 5 by rotating a gear 62 by means of an optical system holder rotating unit 63. Namely, the optical system holder is moved such that the optical axis of the light detecting optical system is rotated substantially centrally of the optical axis of the previously-described electron optical system. The light emitted from the specimen 51 is detected by the photodetector 11 of the light detecting optical system and inputted to a signal processing unit (electronic computer) 111. The signal processing unit 111 forms a specimen image in correspondence to a deflecting electrode control signal from the electron beam scanning control unit 33 and a light signal from the specimen. In addition to formation of the specimen image and display thereof on a display, the signal processing unit (electronic computer) 111 controls the optical system holder rotating unit 63 to set the position of the specimen 51 relative to the light detecting optical system. On the other hand, an insulating layer 52 is interposed between the specimen holder 5 and the XY stage 53 and a potential applying unit 21 is connected to the specimen holder 5. The potential applying unit 21 includes a variable power supply and can adjust the potential of the specimen 51 on the specimen holder 5 between earth potential (0 eV) and desired negative potential. Normally, the electron source 1 is applied with a negative high voltage (−1 to −30 kev) and therefore, when the specimen 51 is at earth potential, the electron beam 2 is irradiated on the specimen 51 while being accelerated by a potential difference of from 1 to 30 keV. This electron beam irradiating condition is suitable for detecting secondary electrons and characteristic X-rays and observing SEM images but is unsuitable for observing the magnetization state of the specimen according to the invention as has already been described. Then, the potential applying unit 21 is controlled by a power supply controller 211 in accordance with an object to be observed so that a negative voltage which is approximately several eV higher than the accelerating voltage of the electron beam may be applied to the specimen holder 5 during the magnetization state observation of the specimen according to the present invention. Through this, the electron beam 2 is decelerated from kilovolt order to several-volt order between the bottom surface of the objective lens 4 at earth potential and the specimen 51 applied with the negative voltage. The deceleration is effective as has already been described with reference to FIG. 3. It must be noticed that when a negative voltage equal to or less than the accelerating voltage is applied to the specimen 51, the magnetization state of the specimen cannot be measured.

Incidentally, the construction of the light detecting optical system can more simplified in the apparatus of the present embodiment (embodiment 9) than in the other embodiments because the light detecting optical system is made to be rotatable relative to the specimen holder 51 and this is on the following ground. In the present invention, the circularly polarized light emitted from the specimen irradiated with the electron beam is detected to measure magnetization information of the specimen and according to properties of the magnetic specimen emitting the circularly polarized light, that is, magnetic circular dichroism (MCD), the detection intensity of the circularly polarized light depends on the relation between the direction of its detection and the magnetization direction of the specimen and is maximized when the two coincides with each other. It is clear from this that when the light detecting optical system moves relative to the specimen holder 51 (especially, along the outer periphery of the specimen holder 51), the detection intensity of the circularly polarized light changes with the positional relation between the light detecting optical system and the specimen holder 51. Accordingly, magnetization information of the specimen (namely, an image based on the circularly polarized light) can be extracted from a difference between images at different locations (a difference image) by sequentially changing the arrangement of the light detecting optical system relative to the specimen holder 51 and scanning the specimen 51 with the electron beam each time the arrangement is changed to form an image by detecting light signal from the photodetector 11 while scanning the electron beam. Obviously, for detection of the magnetization information, it is important that the incident electron beam be decelerated suitably by the previously-described potential applying unit 21. Further, in order to steadily suppress noise components liable to interfere with the magnetization information of the specimen, a deflecting component separating means (for example, a quarter wave plate and a polarizer or a polarizing prism) may be provided in the light detecting optical system as in the other embodiments. In the apparatus of FIG. 15, the specimen holder 5 is moved relative to the light detecting optical system but the specimen holder 5 may be moved (rotated) relative to the light detecting optical system as in the apparatus of FIG. 13 to attain the same effect and in that case, too, the construction of the light detecting optical system can be simplified. In other words, the embodiment 9 is structurally featured in that the position control means is provided which changes (namely, controls and sets) the relative positional relation (arrangement) between the specimen holding means for holding the specimen and the light detecting means for detecting light from the specimen.

We claim:

1. An electron microscope having an electron source for emitting an electron beam, an electron optical system for focusing the electron beam from said electron source, a specimen holder on which a specimen is carried, deflecting means for irradiating said electron beam on the specimen carried on said specimen holder, and decelerating means provided between said specimen holder and said electron optical system for decelerating and irradiating the electron beam on the specimen, said electron microscope comprising a detecting optical system including a quarter wave plate and a polarizer which separate and detect a polarized component of an electromagnetic wave of circular polarization from a specimen carried by said specimen holder.

2. An electron microscope according to claim 1, further comprising magnetic field applying means provided on said specimen holder for applying a magnetic field to a specimen carried by said specimen holder.

3. An electron microscope according to claim 1, further comprising temperature setting means provided on said specimen holder for setting a temperature of a specimen carried by said specimen holder.

4. In an electron microscope, a method comprising the steps of accelerating and focusing an electron beam, deflecting the focused electron beam to a predetermined position, decelerating the accelerated electron beam, irradiating a decelerated and focused electron beam on a specimen, detecting circularly polarized light emitted from a magnetization area of said specimen, and forming an image by detecting a signal of said circularly polarized light in registration with an electron beam irradiated position on said specimen.

5. An electron microscope method according to claim 4, wherein in said step accelerating and focusing the electron beam, the acceleration of the electron beam is carried out by setting energy of said electron beam to 100 eV or less.

* * * * *